United States Patent
Daoudi et al.

(10) Patent No.: US 10,379,151 B2
(45) Date of Patent: Aug. 13, 2019

(54) METHOD FOR RECOGNIZING PARTIAL DISCHARGES EMITTED INSIDE OR OUTSIDE AN ELECTRICAL APPARATUS

(71) Applicant: ALSTOM TECHNOLOGY LTD, Baden (CH)

(72) Inventors: Bouchra Daoudi, Les Mureaux (FR); Raphaël Lebreton, Massy (FR); Sébastien Louise, Choisy le Roi (FR); Gilbert Luna, Villepinte (FR)

(73) Assignee: General Electric Technology GmbH, Baden (CH)

( * ) Notice: Subject to any disclaimer, the term of this patent is extended or adjusted under 35 U.S.C. 154(b) by 730 days.

(21) Appl. No.: 14/379,731

(22) PCT Filed: Mar. 6, 2013

(86) PCT No.: PCT/EP2013/054489
§ 371 (c)(1),
(2) Date: Aug. 19, 2014

(87) PCT Pub. No.: WO2013/131948
PCT Pub. Date: Sep. 12, 2013

(65) Prior Publication Data
US 2015/0301102 A1  Oct. 22, 2015

(30) Foreign Application Priority Data
Mar. 9, 2012 (FR) ..................... 12 52152

(51) Int. Cl.
*G01R 31/12* (2006.01)
*G06T 7/00* (2017.01)
(Continued)

(52) U.S. Cl.
CPC ..... *G01R 31/1218* (2013.01); *G01R 31/1227* (2013.01); *G06F 16/5838* (2019.01);
(Continued)

(58) Field of Classification Search
CPC ............ G01R 31/1218; G01R 31/1227; G01R 31/1227; G06F 17/30256; G06K 9/00536; G06T 1/0007; G06T 7/001
See application file for complete search history.

(56) References Cited

U.S. PATENT DOCUMENTS 5,166,694 A  11/1992  Russell et al.
5,703,564 A  12/1997  Begum et al.
(Continued)

FOREIGN PATENT DOCUMENTS

EP  0 955 550 A1  11/1999
EP  1 439 396 A2  7/2004
(Continued)

OTHER PUBLICATIONS

Zierhut et al., Influence of Modifications in Partial Discharge Patterns on a Neural Network's Recognition Ability, Aug. 1999, IEE, pp. 1-4.*
(Continued)

*Primary Examiner* — Sujoy K Kundu
*Assistant Examiner* — L. Anderson
(74) *Attorney, Agent, or Firm* — Eversheds Sutherland (US) LLP

(57) ABSTRACT

A method of recognizing partial discharges emitted inside or outside electrical equipment after at least one partial discharge activity has been detected Partial discharge patterns are recorded beforehand in a data base, each pattern being associated with the type of fault that generated it. A new partial discharge (Pd) pattern is acquired. The new partial discharge pattern is compared with discharge patterns that are already recorded in the data base The matching fault in the equipment is obtained by deduction, and the result is recorded in the data base.

11 Claims, 4 Drawing Sheets

(51) Int. Cl.
- *G06T 1/00* (2006.01)
- *G06F 17/30* (2006.01)
- *G06K 9/00* (2006.01)
- *G06F 16/583* (2019.01)
- *G01R 31/02* (2006.01)
- *G01R 31/28* (2006.01)

(52) U.S. Cl.
CPC ........ *G06K 9/00536* (2013.01); *G06T 1/0007* (2013.01); *G06T 7/001* (2013.01); *G01R 31/027* (2013.01); *G01R 31/2846* (2013.01); *G06T 2207/10024* (2013.01)

(56) References Cited

U.S. PATENT DOCUMENTS

| | | | |
|---|---|---|---|
| 5,903,158 A * | 5/1999 | Eriksson | G01R 31/1227 324/536 |
| 7,142,757 B1 | 11/2006 | Ward | |
| 7,171,091 B1 | 1/2007 | Ward | |
| 8,755,658 B2 | 6/2014 | Proulx | |
| 2004/0204873 A1* | 10/2004 | Freisleben | G01R 31/1272 702/57 |
| 2008/0199135 A1 | 8/2008 | Proulx | |
| 2009/0119035 A1 | 5/2009 | Younsi et al. | |
| 2009/0201953 A1 | 8/2009 | Peyghambarian et al. | |
| 2010/0247046 A1 | 9/2010 | Dong et al. | |
| 2012/0143533 A1 | 6/2012 | Luna et al. | |
| 2013/0090883 A1 | 4/2013 | Louise et al. | |
| 2014/0239969 A1 | 8/2014 | Lebreton et al. | |

FOREIGN PATENT DOCUMENTS

| | | | | |
|---|---|---|---|---|
| JP | 2005233837 | * | 9/2005 | ......... G01R 31/1254 |
| WO | 2011/051910 A1 | | 5/2011 | |
| WO | 2011/157753 A1 | | 12/2011 | |
| WO | 2013/041566 A1 | | 3/2013 | |
| WO | 2013/131948 A1 | | 9/2013 | |

OTHER PUBLICATIONS

International Search Report in PCT/EP2013/054489, European Patent Office, Rijswijk, NL, dated Apr. 5, 2013.
Montanari G C et al., "A new approach to partial discharge testing of HV cable systems", IEEE Electrical Insulation Magazine, IEEE Service Center, New York, NY, US, vol. 11, No. 1, Jan. 1, 2006, pp. 14-23.
Cavallini A et al., "A new approach to diagnosis of solid insulation systems based on PD signal inference", IEEE Electrical Insulation Magazine, IEEE Service Center, New York, NY, US, vol. 11, No. 2, Mar. 1, 2003, pp. 23-30.
Strachan S M et al., "Knowledge-based diagnosis of partial discharges in power transformers", IEEE Transactions on Dielectrics and Electrical Insulation, IEEE Service Center, Piscataway, NJ, US, vol. 15, No. 1, Feb. 1, 2008, pp. 259-268.
Borghetto J et al., "Partial Discharge Inference by an Advanced System. Analysis of Online Measurements Performed on Hydrogenerator", IEEE Transactions on Energy Conversion, IEEE Service Center, Piscataway, NJ, US, vol. 19, No. 2, Jun. 1, 2004, pp. 333-339.
N. C. Sahoo et al., "Trends in partial discharge pattern classification: a survey", IEEE Transactions on Dielectrics and Electrical Insulation, vol. 12, No. 2, Apr. 1, 2005, pp. 248-264.
A. Contin et al., "Digital detection and fuzzy classification of partial discharge signals", IEEE Transactions on Dielectrics and Electrical Insulation, vol. 9, No. 3, Jun. 1, 2002, pp. 335-348.
Non-Final Office Action dated Jun. 29, 2015 in U.S. Appl. No. 14/346,309.
Luo, R. et al., "Study on Partial Discharge Localization by Ultrasonic Measuring in Power Transformer Based on Particle Swarm Optimization", 2008International Conference on High Voltage Engineering and Application, ICHVE, 2008, Nov. 9-13, 2008, pp. 600-603.
Moore, P. et al "Radiometric Location of Partial Discharge Sources on Energized High-Voltage Plant", IEEE Transactions on Power Delivery, vol. 20, Issue 3, IEEE, Jul. 1, 2005, pp. 2264-2272.
Portugues, I. et al "RF-Based Partial Discharge Early Warning System for Air-Insulated Substations", IEEE Transactions on Power Delivery, vol. 24, Issue1, IEEE, Jan. 1, 2009, pp. 20-29.
Stewart, B.G. et al "Triangulation and 3D Location Estimation of RFI and Partial Discharge Sources Within a 400kV Substation", Electrical Insulation Conference, 2009, IEEE, Piscataway, NJ, USA, May 1, 2009, pp. 164-168.
Tsui, J. et al, "Basic GPS Concept" Fundamentals of Global Positioning System Receivers: A Software Approach, Chapter Two, Jan. 27, 2005, pp. 7-31.
Win, S.S. et al., "Partial Discharge Detection and Localization in Power Transformers", 8th International Conference on Electrical Engineering/Electronics, Computer, Telecommunications and Information Technology (ECTI-CON), May 17-19, 2011, pp. 673-676.
PCT International Preliminary Report on Patentability in Application No. PCT/EP2013/054489, dated Mar. 18, 2014.
PCT International Search Report and Written Opinion in Application No. PCT/EP2012/068441, dated Oct. 23, 2012.
PCT International Preliminary Report on Patentability in Application No. PCT/EP2012/068441, dated Apr. 3, 2014.
PCT International Search Report and Written Opinion in Application No. PCT/EP2011/059947, dated Oct. 11, 2011.
PCT International Preliminary Report on Patentability in Application No. PCT/EP2011/059947, dated Jan. 3, 2013.
French Search Report in French Patent Application No. FR1252152, dated Nov. 29, 2012.

* cited by examiner

METHOD FOR RECOGNIZING PARTIAL DISCHARGES EMITTED INSIDE OR OUTSIDE AN ELECTRICAL APPARATUS

CROSS-REFERENCE TO RELATED PATENT APPLICATION

The present application is a National Stage Application of International Application No. PCT/EP2013/054489 entitled "METHOD FOR RECOGNIZING PARTIAL DISCHARGES EMITTED INSIDE OR OUTSIDE AN ELECTRICAL APPARATUS" filed Mar. 6, 2013, which claims priority to French Patent Application Number 12 52152 filed Mar. 9, 2012, the contents of which are incorporated herein by reference in their entirety.

TECHNICAL FIELD

The invention relates to a method of recognizing partial discharges emitted inside and outside electrical equipment. The invention relates to image recognition adapted to the patterns obtained during measurement of partial discharges in equipment or in the vicinity of said equipment.

STATE OF THE PRIOR ART

Electrical equipment having air, oil, or paper, . . . insulation that is failing produces partial discharges that may impair insulation until said insulation loses its insulating properties completely and becomes conductive. A breakdown phenomenon then occurs, and that may lead to at least partial destruction of said equipment. Partial discharge measurements in accordance with IEC standard 60 270 make it possible to prevent said breakdown phenomenon, to analyze the discharges in equipment, to diagnose a fault, and therefore to monitor and protect electrical equipment. The supply of electricity to a factory, to a town, or to entire regions may depend on such protection. Each fault has its own partial discharge pattern with an appearance and disappearance voltage, variation over time, . . . . However, even though each discharge pattern is different, similar trends may be observed as a function of the fault that causes the discharge. By way of example, a fault that is due to poor impregnation of the insulation or to poor drying of the insulation creates a discharge pattern of the type shown in FIG. 1, even though the phase (as a function of the phase on which the measurement is connected), the amplitude, and the pattern itself may change. Recognizing a partial discharge pattern makes it possible to identify a fault and simultaneously to know what corrective measures need to be taken in order to eliminate it. At present, recognizing such partial discharges is a task for experts; however, for obvious reasons of cost and time, each factory developing equipment that uses solid or liquid insulation must be able to diagnose quickly the cause of partial discharges, should they occur.

Recognizing such partial discharges is critical for manufacturers of large industrial electrical equipment (motors, transformers, high- and medium-voltage gas-insulated switchgear (GIS), . . . ).

Partial discharges in high-voltage equipment, such as large power transformers, are associated with the emission of high-frequency or ultra-high frequency waves and acoustic waves (generally ultrasound waves) that spread through the acoustically conductive fluid. It is thus possible to detect and to try to locate those partial discharge sources by means of acoustic detectors, possibly associated with electrical detection means for detecting high-frequency or ultra-high frequency waves.

Image recognition is quite widespread, but none is adapted to partial discharges.

A pattern recognition system is described in U.S. Pat. No. 5,703,564. That system uses statistical classification. However, that system does not describe image recognition adapted to the patterns obtained while measuring partial discharges.

The invention aims to facilitate diagnosis of a fault inside or outside equipment by using the phase image, or pattern, of partial discharges, by enabling one discharge pattern to be matched easily and automatically with another in a data base. Once a partial discharge pattern has been obtained, the invention thus makes it possible to correlate said pattern with the other partial discharge patterns stored in the data base so as to obtain information about the fault if said fault has already been observed and dealt with.

SUMMARY OF THE INVENTION

The invention provides a progressive method of recognizing partial discharges emitted inside or outside electrical equipment, the method being characterized in that this recognition of the partial discharges is shape recognition of partial discharge patterns comprising acquiring color images obtained by measuring a series of partial discharges in phase (abscissa) and in amplitude (ordinate) and processing and transposing the color images into black and white images, and in that after recording known partial discharge patterns in a data base with each pattern being recorded in association with the type of fault that generated it, and after detecting at least some partial discharge activity, said method comprises the following steps:

acquiring a new partial discharge pattern;
comparing said new partial discharge pattern with discharge patterns that are already recorded in the data base;
after diagnosing the source of said partial discharges, obtaining the matching fault in the equipment; and
recording the result thus obtained in the data base.

Advantageously, the method of the invention includes an automatic correction step for adjusting processing of the new partial discharge pattern, a step of making the surface area of the new partial discharge pattern uniform, and a step of classifying the new partial discharge pattern in one of various categories, by sub-dividing the new pattern of said partial discharges into different zones, e.g. into four equal portions, splitting it in two both horizontally and vertically.

Advantageously, during the comparison step, a match percentage calculation is performed between the new partial discharge pattern and the patterns that are already recorded in the data base, and matches are classified by decreasing percentage.

Advantageously, the method of the invention includes the following steps:

entering a color image corresponding to the new pattern of said partial discharges;
processing and transposing the color image into a black and white image;
testing whether an image remains;
if no images remain:
adjusting the color image processing parameters and returning to the start of the first step;
if an image remains:

checking to find out whether the size of the partial discharge pattern is significant;

if the size is not significant:

expanding the partial discharge pattern along the ordinate axis;

if the size is significant:

sub-dividing the partial discharge pattern into a plurality of zones of interest, e.g. four zones;

analyzing said zones of interest in order to classify the partial discharge pattern;

comparing the partial discharge pattern with corresponding discharge patterns in the data base;

listing the matching partial discharge patterns;

diagnosing the source of said partial discharge;

if diagnosis indicates an inside source of discharge then examining the equipment in order to repair said equipment and correlating the diagnosis; and recording the results thus obtained in the data base.

Advantageously, the invention provides pattern recognition adapted to partial discharge patterns, for which there is currently no tool available on the market. The invention makes it possible very efficiently to sort in the data base different partial discharge patterns recorded in a factory, a laboratory, or on-site. This sorting helps the user to diagnose the fault at the origin of said partial discharge activity in a time that is much shorter than if said user was required to search manually for a match in the data base.

DETAILED DESCRIPTION OF PARTICULAR EMBODIMENTS

Partial discharges are very difficult to recognize as a result of the way they are very sensitive to surrounding electrical factors, since the patterns of said discharges depend on the capacitances, inductances, impedances, etc. of the equipment in which said partial discharges may appear. Since pieces of equipment are all different, partial discharge patterns are always all different. The overall appearance of a partial discharge pattern is defined by the type of fault that this discharge activity creates. If it is possible to recognize a partial discharge pattern, and if this type of partial discharge pattern is known, then it is possible to identify the fault that generated said partial discharges and to provide a diagnosis. The invention therefore proposes using a data base containing as many known partial discharge patterns as possible and trying to match a new partial discharge pattern with a known partial discharge pattern. If a new partial discharge pattern can be likened to a known partial discharge pattern, then the fault is identified.

Advantageously, the partial discharge patterns are classified beforehand into different categories so as to reduce the risk of error during identification of a partial discharge pattern. These easily-identifiable categories make it possible to improve recognition of partial discharges in the categories selected. Once this specific classification has been obtained, any image recognition method can be used to correlate a new partial discharge pattern with the partial discharge patterns of a corresponding category.

The invention makes it possible to assist and to automate recognition of partial discharges both for experts and for non-experts. When a new partial discharge pattern is encountered, the invention may enable it to be compared to a partial discharge pattern that has already been encountered and diagnosed, on the basis of problems that have already been resolved and stored in a data base, for example. The method of the invention is progressive, and is based on a data base that it enriches progressively as investigations continue.

Figure 2:
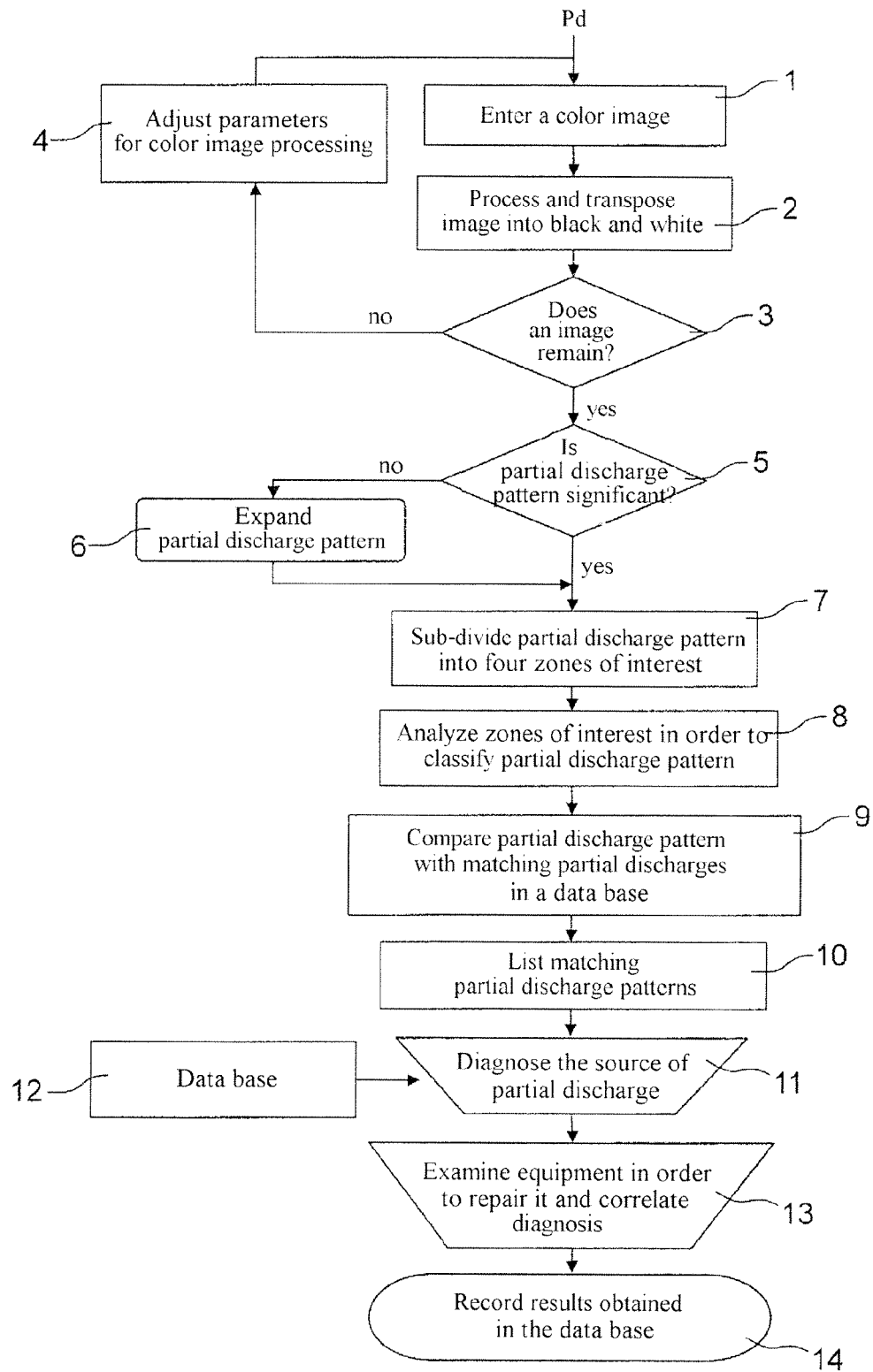
FIG. 2 is a flow chart showing the overall operation of the method of the invention.

The overall operation of the method of the invention is described in the flow chart of FIG. 2. After detecting at least one partial discharge Pd, this flowchart comprises the following steps:

entering a color image (1) corresponding to the new pattern of said partial discharges;

processing and transposing the color image into a black and white image (2);

testing whether an image remains (3);

if no images remain:

adjusting the color image processing parameters (4) and returning to the start of the first step (1);

if an image remains:

checking to find out whether the size of the partial discharge pattern is significant (5);

if the size is not significant:

expanding the partial discharge pattern along the ordinate axis (6);

if the size is significant:

sub-dividing the partial discharge pattern into a plurality of zones of interest (7), e.g. four zones;

analyzing said zones of interest in order to classify the partial discharge pattern (8);

comparing the partial discharge pattern with corresponding partial discharge patterns in a data base (9);

listing the matching partial discharge patterns (10);

diagnosing the source of the partial discharge (11), by means of the data base (12);

if diagnosis indicates an inside source of discharge then examining the equipment in order to repair said equipment (13) and correlating the diagnosis; and recording the results thus obtained (14) in the data base.

Figure 1:
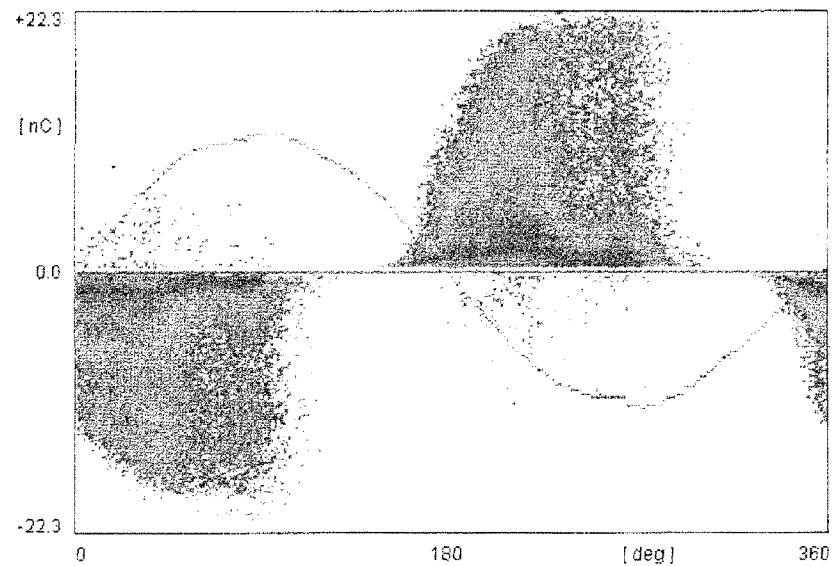
FIG. 1 shows a partial discharge pattern.

This flowchart begins with acquiring a new partial discharge pattern having the appearance of a color image (e.g. the discharge pattern in FIG. 1). This new pattern of a partial discharge, inside or outside equipment, corresponds to a fault that must be diagnosed in order to be repaired or dealt with without repair if that is possible. Since such repairs generate delays and considerable costs, it is essential to be able to avoid any incorrect diagnosis. A partial discharge pattern is a reading built-up from a series of partial discharges measured in phase with a test voltage. Each point of this pattern corresponds to an amplitude (or magnitude) of the discharge measured in coulombs (C) at a given instant (phase measured in degrees, from 0 to 360°) of the sinewave that powers the equipment.

Figure 3:
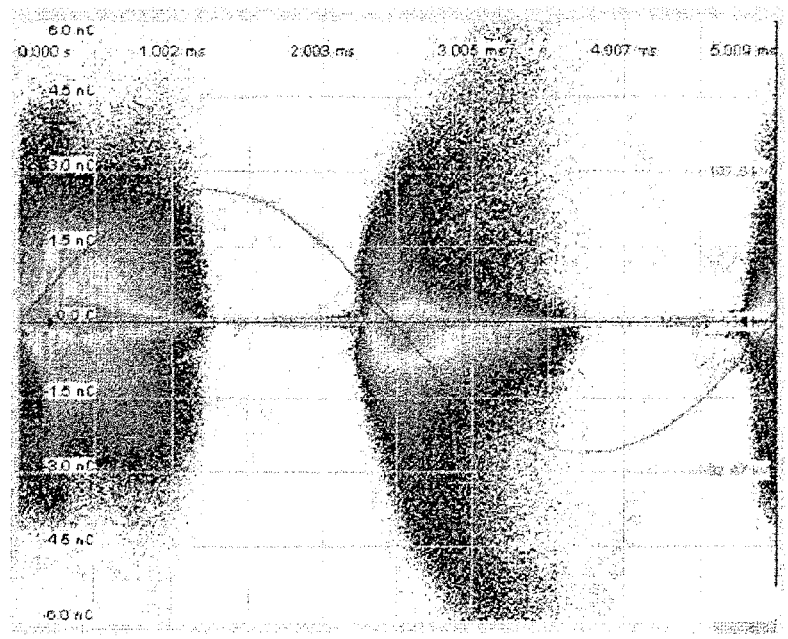
FIGS. 3 to 5 show different partial discharge patterns.
Figure 4:

The color image is then processed and transposed into a black and white image (step 2). This step is necessary in order to use the images coming from different pieces of partial discharge measuring equipment that do not necessarily use the same color for displaying discharges. FIG. 3 thus shows a discharge measurement made using equipment that is different from the equipment used in FIG. 1. The result of changing into black and white is shown in FIG. 4.

Step 3 consists in checking that a partial discharge pattern is still present. By way of example, if the discharge measurement was performed too quickly, points might not have been concentrated sufficiently and they will be lost during processing. If it turns out that the discharge pattern is indeed not very distinct and that detail has been lost, the method of the invention automatically corrects its processing settings in order to perform a more finely-tuned adjustment and in order to try to conserve as many points as possible. However, certain discharge recordings containing only a few sparse points cannot be used.

Step 5 serves to make the partial discharge patterns uniform in area. In order to better recognize discharge patterns, it is recommended that they occupy the same amount of space in the image. A very flat partial discharge pattern is difficult to recognize. Step 5 consists in expanding the discharge pattern by zooming along the ordinate axis, or increasing measurement gain. By way of example, if the discharge pattern occupies less than one-third of the space in amplitude (vertical scale) then the partial discharge pattern is expanded.

Figure 5:
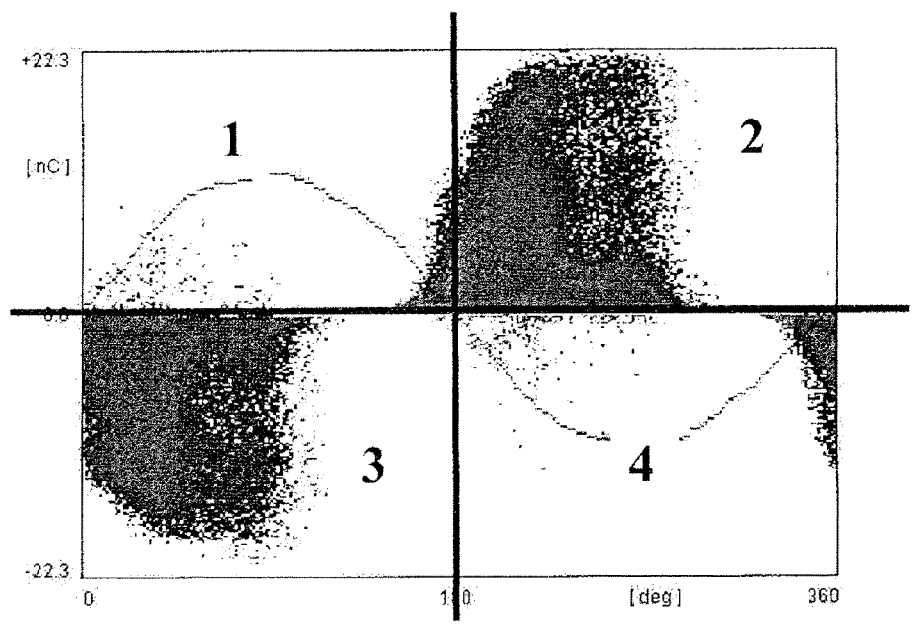

Step 7 consists in sub-dividing the partial discharge pattern into four equal portions, splitting it in two both horizontally and vertically. The four zones obtained are numbered from 1 to 4, as shown in FIG. 5. This sub-division then makes it possible to classify the partial discharge pattern in one of the following categories: 0, 1, 2, 3, or 4. For indirect measurement mounting (measurement probe placed in parallel with the equipment), partial discharge patterns mainly having their partial discharges in zones 2 and 3 are put into category 1; partial discharge patterns mainly having their partial discharges in zones 1 and 4 are put into category 2; partial discharge patterns mainly having their partial discharges in zones 1 and 3, or 2 and 4, or when the majority of the partial discharges lies in a single zone, are put into category 3; when all four zones have an equivalent amount of partial discharge they are put into category 4, and partial discharge patterns that do not fall under any other category are put into category 0.

Step 9 consists in comparing said new discharge pattern with existing partial discharge patterns in a data base. This data base comprises all of the previously-recorded partial discharge patterns and the associated diagnosis if a fault has been correlated with the partial discharge pattern. Comparing this new partial discharge pattern with partial discharge patterns in the data base makes it possible to find identical faults that have already been diagnosed, having repair techniques that are known and tested. In order to perform the comparison and thus have the best possible results, the method of the invention consists in relying on a category assigned to the discharge pattern and, as a function of said category, comparing said partial discharge pattern with discharge patterns in the data base belonging to specified categories, as shown in the table below:

| Category of the partial discharge pattern to compare | Categories of partial discharge patterns in the data base (for comparison) |
| --- | --- |
| 0 | 0 - 1 - 4 |
| 1 | 0 - 1 - 4 |
| 2 | 2 |
| 3 | 0 - 3 |
| 4 | 0 - 1 - 3 |

Such selective comparison enables better reliability than an overall comparison, i.e. not taking all categories into account. For direct measurement mounting (measurement probe situated between the power supply and the equipment), a symmetrical image is created as seen looking along the abscissa axis of the discharge pattern before comparison. Zones 1 and 2 are the result of the symmetry of zones 3 and 4 along the abscissa axis, and correspondingly zones 3 and 4 are the result of the horizontal symmetry of zones 1 and 2.

This comparison may be performed using any existing method, e.g.: by pattern recognition, assignment of vectors specific to certain aspects of the patterns of said partial discharges and searching for corresponding vectors, point-by-point comparison, etc. A match percentage is then calculated between the pattern of said partial discharges to be identified and the partial discharge patterns in the corresponding category. Matches are classified by decreasing percentage. The patterns of the discharges of a same fault often have a match of more than 60%. However, given the complexity of the discharge patterns that can be measured, there may be different faults also having a discharge pattern match percentage of more than 60%. Since the human eye is capable of likening a meaningful match with a meaningless match, the aim of this comparison is to facilitate pre-selection and to make said selection as close as possible to reality.

Figures 6A, 6B:
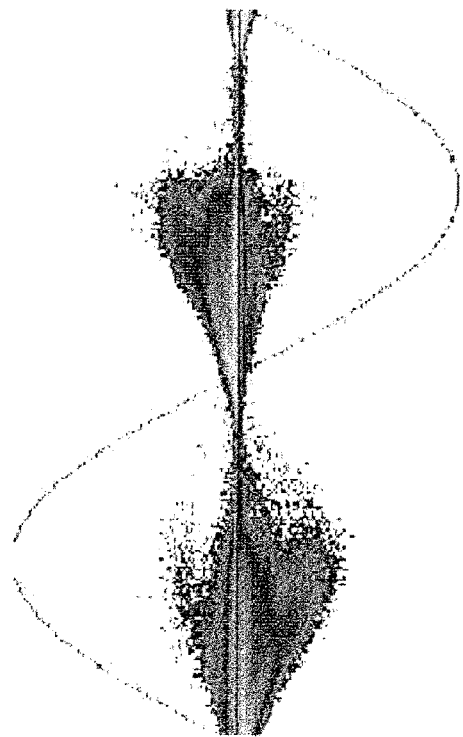
FIGS. 6a and 6b show how two partial discharge patterns are compared.

The data base may be substantial: several hundreds or even thousands of examples, depending on experience. Once the match has been found and the equipment has been repaired, the data base is enriched with the feedback from the experience of the fault that caused the partial discharges. By way of example, when an attempt is made to compare the partial discharge pattern in FIG. 6a with more than 100 other discharge patterns in a data base, the partial discharge pattern in FIG. 6b appears in the top five results, even though zones 1 and 4 are almost empty of discharges in FIG. 6b, unlike in FIG. 6a.

The invention claimed is:

1. A progressive method of recognizing partial discharges emitted inside or outside electrical equipment, wherein this recognition of partial discharges is shape recognition of the partial discharge patterns wherein after recording known partial discharge patterns in a data base with each pattern being associated with the type of fault that generated it, and after detecting at least one partial discharge activity, said method comprises the following steps:
    acquiring a color image by measuring a series of partial discharge patterns in phase and in amplitude, the series of partial discharge patterns resulting from the emitted partial discharges at the equipment
    processing and transposing the color image into a black and white image;
    acquiring a new partial discharge pattern from the black and white image;
    sub-dividing the new partial discharge pattern into four equal portions by splitting the new partial discharge pattern in two along a horizontal axis, and in two along a vertical axis;
    analyzing the four equal portions to allocate a category to the new partial discharge pattern;
    comparing, as a function of the category, said new partial discharge pattern with partial discharge patterns that are already recorded in the data base;
    diagnosing a source of said new partial discharge pattern and obtaining a matching fault in the equipment; and
    recording the diagnosing and matching result obtained in the data base.

2. A method according to claim 1, including an automatic correction step for adjusting parameters of the processing of the color image.

3. A method according to claim 1, including a step of making the surface area of the new partial discharge pattern uniform.

4. A method according to claim 1, wherein the step of comparing the new partial discharge pattern with partial discharge patterns comprises computing a match percentage between the new partial discharge pattern and the patterns that are already recorded in the data base, and classifying matches by decreasing percentage.

5. A method according to claim 1, including the following steps:
   entering the color image corresponding to the new pattern of said partial discharges;
   processing and transposing the color image into the black and white image;
   testing whether an image remains;
      if no images remain:
         adjusting parameters of the processing of the color image and returning to the start of the first step;
      if an image remains:
         checking to find out whether a size of the partial discharge pattern is greater than a predetermined threshold;
         if the size is lower than the predetermined threshold:
            expanding the partial discharge pattern along the ordinate axis;
         if the size is greater than or equal to the predetermined threshold:
            sub-dividing said partial discharge pattern into four zones of interest;
            analyzing said zones of interest in order to classify the partial discharge
            comparing the partial discharge pattern with corresponding partial discharge patterns in the data base;
            listing the matching partial discharge patterns;
            diagnosing the source of said partial discharge;
            if diagnosis indicates an inside source of discharge then examining the equipment in order to repair said equipment and correlating the diagnosis; and
            recording the results thus obtained in the data base.

6. A progressive method of recognizing partial discharges emitted inside or outside an electrical equipment, the method comprising recording known partial discharge patterns in a data base, each known partial discharge pattern being associated with a type of fault that generated it,
   the method further comprising, upon detection of a partial discharge activity:
      generating a color image by processing a series of partial discharge patterns in phase and in amplitude, the partial discharge patterns being measured with a measurement probe connected to the electrical equipment;
      transposing the color image into a black and white image, the black and white image forming a new partial discharge pattern representative of the partial discharge activity;
      sub-dividing the new partial discharge pattern into four equal portions, by splitting the new partial discharge pattern in two along a horizontal axis, and in two along a vertical axis;
      analyzing the four equal portions to allocate a category to the new partial discharge pattern;
      selecting, in the data base, known partial discharge patterns as a function of the category allocated to the new partial discharge pattern;
      comparing the new partial discharge pattern with the selected known partial discharge patterns, thereby obtaining a result;
      as a function of the result, retrieving, from the data base, the type of fault generating the partial discharge activity; and
      recording the result in the data base.

7. The method according to claim 6, further comprising automatically adjusting parameters for generating the color image.

8. The method according to claim 6, including making a surface area of the new partial discharge pattern uniform.

9. The method according to claim 6, wherein comparing the new partial discharge pattern with the selected known partial discharge patterns comprises computing a match percentage between the new partial discharge pattern and the selected known partial discharge patterns, and classifying matches by decreasing percentage.

10. The method according to claim 6, further comprising, after transposing the color image into the black and white image, and before sub-dividing the new partial discharge pattern:
    testing the black and white image to assess whether an image remains; and
       if no image remains, adjusting parameters of the processing of the color image, then performing again generating the color image and transposing the color image into a black and white image to obtain the new partial discharge pattern;
       if an image remains, comparing a size of the new partial discharge pattern to a predetermined threshold, and
          if the size is lower than the predetermined threshold, expanding the new partial discharge pattern along an ordinate axis;
          if the size is greater than or equal to the predetermined threshold, not expanding the new partial discharge pattern.

11. A progressive method of recognizing partial discharges emitted inside or outside an electrical equipment, the method comprising recording known partial discharge patterns in a data base, each known partial discharge pattern being associated with a type of fault that generated it,
    the method further comprising, upon detection of a partial discharge activity, the steps of:
       generating a color image by processing a series of partial discharge patterns in phase and in amplitude, the partial discharge patterns being measured with a measurement probe connected to the electrical equipment;
       transposing the color image into a black and white image, the black and white image forming a new partial discharge pattern representative of the partial discharge activity;
       testing the black and white image to assess whether an image remains; and
          if no image remains, adjusting parameters of the processing of the color image, then performing again the steps of generating the color image and transposing the color image into a black and white image to obtain the new partial discharge pattern;
          if an image remains, comparing a size of the new partial discharge pattern to a predetermined threshold, and
             if the size is lower than the predetermined threshold, expanding the new partial discharge pattern along an ordinate axis;

if the size is greater than or equal to the predetermined threshold, not expanding the new partial discharge pattern;
sub-dividing the new partial discharge pattern into four equal portions, by splitting the new partial discharge pattern in two along a horizontal axis, and in two along a vertical axis;
analyzing the four equal portions to allocate a category to the new partial discharge pattern;
selecting, in the data base, known partial discharge patterns as a function of the category allocated to the new partial discharge pattern;
comparing the new partial discharge pattern with the selected known partial discharge patterns, thereby obtaining a result;
as a function of the result, retrieving, from the data base, the type of fault generating the partial discharge activity; and
recording the result in the data base.

* * * * *